(12) United States Patent
Wu et al.

(10) Patent No.: US 9,134,624 B2
(45) Date of Patent: Sep. 15, 2015

(54) LITHOGRAPHY MACHINE AND SCANNING AND EXPOSING METHOD THEREOF

(71) Applicant: Semiconductor Manufacturing International Corp., Shanghai (CN)

(72) Inventors: Qiang Wu, Shanghai (CN); Jing'an Hao, Shanghai (CN); Chang Liu, Shanghai (CN); Xin Yao, Shanghai (CN); Tianhui Li, Shanghai (CN); Qiang Shu, Shanghai (CN); Yiming Gu, Shanghai (CN)

(73) Assignee: SEMICONDUCTOR MANUFACTURING INTERNATIONAL CORP, Shanghai (CN)

( * ) Notice: Subject to any disclaimer, the term of this patent is extended or adjusted under 35 U.S.C. 154(b) by 383 days.

(21) Appl. No.: 13/730,818

(22) Filed: Dec. 28, 2012

(65) Prior Publication Data
US 2013/0169946 A1 Jul. 4, 2013

(30) Foreign Application Priority Data
Dec. 31, 2011 (CN) .......................... 2011 1 0459524

(51) Int. Cl.
| | | |
|---|---|---|
| *G03B 27/42* | (2006.01) | |
| *G03B 27/68* | (2006.01) | |
| *G03B 27/54* | (2006.01) | |
| *G03B 27/32* | (2006.01) | |
| *G03F 7/20* | (2006.01) | |
| *G03B 27/58* | (2006.01) | |
| *G03B 27/62* | (2006.01) | |

(52) U.S. Cl.
CPC .................................. *G03F 7/70358* (2013.01)

(58) Field of Classification Search
CPC .............. G03F 7/7055; G03F 7/70558; G03F 7/70691; G03F 7/70716; G03F 7/70725; G03F 7/70758; G03F 7/70775
USPC ................. 355/52, 53, 55, 67–77; 250/492.1, 250/492.2, 492.22, 493.1, 548; 430/5, 8, 430/22, 30, 311, 312, 321
See application file for complete search history.

(56) References Cited

U.S. PATENT DOCUMENTS

| | | | | |
|---|---|---|---|---|
| 5,995,203 | A * | 11/1999 | Ueda ................................ | 355/67 |
| 7,068,350 | B2 * | 6/2006 | Nishi et al. ...................... | 355/53 |
| 2001/0021009 | A1 * | 9/2001 | Yuan et al. ...................... | 355/53 |
| 2001/0024269 | A1 * | 9/2001 | Koide et al. ..................... | 355/69 |
| 2003/0102721 | A1 * | 6/2003 | Ueta et al. ........................ | 310/12 |
| 2007/0166633 | A1 * | 7/2007 | Yamada .......................... | 430/30 |
| 2009/0161089 | A1 * | 6/2009 | Leenders et al. ................ | 355/76 |
| 2010/0290022 | A1 * | 11/2010 | Butler ............................. | 355/69 |
| 2012/0170008 | A1 * | 7/2012 | Emoto et al. .................... | 355/30 |
| 2012/0224161 | A1 * | 9/2012 | Beerens et al. ................. | 355/67 |
| 2013/0321823 | A1 * | 12/2013 | Takahashi ..................... | 356/601 |

* cited by examiner

*Primary Examiner* — Christina Riddle
(74) *Attorney, Agent, or Firm* — Anova Law Group, PLLC

(57) ABSTRACT

The present disclosure provides a lithography machine and a scanning and exposing method thereof. According to the scanning and exposing method, the scanning and exposing process for a whole wafer includes two alternately circulated motions: a scanning and exposing motion and a stepping motion; and the scanning and exposing motion is a sinusoidal motion rather than a rapid-acceleration uniform-speed rapid-deceleration scanning and exposing motion in the conventional techniques. During the scanning of a single exposure shot, it may begin to scan the exposure shot once a wafer stage and a reticle stage begin to accelerate from zero speed. And the scanning and exposing may not end until the speeds of the wafer stage and the reticle decrease to zero. Therefore, the effective time of the scanning and exposing in the scanning and exposing motion is greatly increased and the production efficiency of the wafer is improved.

9 Claims, 5 Drawing Sheets

LITHOGRAPHY MACHINE AND SCANNING AND EXPOSING METHOD THEREOF

CROSS-REFERENCES TO RELATED APPLICATIONS

This application claims the priority of Chinese patent application no. 201110459524.3, filed on Dec. 31, 2011, the entire contents of which are incorporated herein by reference.

FIELD OF THE DISCLOSURE

The present disclosure relates to a lithography machine and a scanning and exposing method thereof.

BACKGROUND OF THE DISCLOSURE

Integrated Circuit (IC) is a product made by an integration of high-technologies such is as the precision machinery, the microelectronics, the computer technology, the control technology, the laser technology and the precision measurement technology. Lithography Technology is one of the most critical factors in the IC manufacturing process and is a very complex process. In simple terms, Lithography Technology can include the following nine steps: vapor prime processing, spin coating, soft baking, alignment, exposure, post-exposure baking, developing, hard baking, and after developing inspection. Among them, the exposure is a critical technology step.

Since the development of semiconductor technology, the lithography has experienced the development process: the contact lithography, the proximity lithography, the scanning projection lithography, and the currently widely used step-and-scan lithography. The step-and-scan lithography is a forefront technology for the IC lithography processing. The step-and-scan lithography projects, via a reduction imaging optical system, which transfer a pattern on a reticle mask onto a single exposure shot (the exposing region on a wafer may be divided into multiple exposure shots, and an exposure shot may include one or more chips on the wafer) of a wafer coated with photoresist, by the synchronous motion of a reticle stage and a wafer stage. After one exposure shot is scanned and exposed, the wafer stage is stepped to another exposure shot and the action of scanning and exposing is repeated. This continues until all the exposure shots on the wafer are scanned and exposed. Then a pattern with a reduced scale is finally duplicated onto the wafer after processes such as shaping and developing. That is to say, the scanning and exposing process for the whole wafer includes two alternately circulated motions: a stepping motion, and a scanning and exposing motion. When a wafer stage is stepped into an exposure shot, the wafer stage and the reticle stage perform the synchronous scanning and exposing process for the exposure shot; and then the wafer stage is stepped into another exposure shot and the synchronous scanning and exposing process is repeated.

FIG. 1 is a diagram of speed curves of a wafer stage and a reticle stage during a scanning and exposing motion of a single exposure shot on a wafer. As shown in FIG. 1, the scanning and exposing motion of a single exposure shot on a wafer may be divided into three obvious stages, namely a starting stage (including an acceleration stage and a stabilizing stage), a scanning and exposing stage (a uniform-speed stage) and an ending stage (a deceleration stage). Firstly, the wafer stage and the reticle stage begin to accelerate from a is stationary state. After the acceleration for a period of time $t_{ac}$, the speed of the wafer stage reaches Vw and the speed of the reticle stage reaches Vr (it is assumed that the size of the pattern on the reticle mask is 4 times as big as the size of a pattern finally formed on the wafer, namely 4Vw=Vr). After stabilizing for a period of time $t_{st}$, the wafer stage and the reticle stage begin to scan and expose at a uniform speed. After scanning and exposing for a period of time $t_{sc}$, the wafer stage and the reticle stage begin to decelerate. After decelerating for a period of time $t_{de}$, the speeds of the wafer stage and the reticle stage are decreased to zero.

As can be seen from above, during the scanning and exposing motion of a single exposure shot, the exposure shot may be scanned and exposed only when the speeds of the wafer stage and the wafer stage actually reach the uniform speed. In other words, during the entire period of time t ($t=t_{ac}+t_{st}+t_{sc}+t_{de}$) for scanning and exposing a single exposure shot, the exposing is effective only during the period of time $t_s$, and the exposing is not effective during other periods of time ($t_{ac}$, $t_{st}$, $t_{de}$). That is to say only $t_{sc}$ is effective time and $t_{ac}$, $t_{st}$ and $t_{de}$ are ineffective. With the conventional techniques, the entire period of time for scanning and exposing a single exposure shot generally lasts for 0.26 s, however the period of time actually used for scanning and exposing only lasts for 0.06 s, which means that the effective period of time for scanning and exposing only accounts for about 20% while the ineffective period of time for scanning and exposing only accounts for about 80%. The ineffective period of time for scanning and exposing increases the total period of time for manufacturing a wafer and limits the production efficiency of the wafer.

Thus, there is a need to provide an improved scanning and exposing method for the lithography machine to avoid low production efficiency.

SUMMARY

In order to solve the above mentioned problem, the present disclosure provides a scanning and exposing method for a lithography machine. The lithography machine includes a wafer stage carrying a wafer to be exposed and a reticle stage carrying a reticle mask, a region on the wafer to be exposed being divided into two or more exposure shots.

The wafer stage is stepped to a first exposure shot. Then the wafer stage and the reticle stage are moved synchronously in opposite directions respectively for scanning and exposing the first exposure shot.

During the scanning and exposing of the first exposure shot, the speed curves of the wafer stage and the reticle stage are sinusoidal curves, and the magnitudes of the speeds of the is wafer stage and the reticle stage gradually increase from zero to a maximum value and then decrease to zero, and the ratio of the magnitude of the speed of the wafer stage to the magnitude of the speed of the reticle stage is equal to the ratio of the size of a pattern finally formed on the wafer to the size of the pattern of the reticle mask.

Moreover, the present disclosure further provides a lithography machine. The lithography machine includes a light source configured to forming a light beam; an optical system; a reticle stage configured to carry a reticle mask; an object lens system configured to project the light beam onto a wafer coated with photoresist, the object lens system comprising more than one lens; a wafer stage configured to carry the wafer; and a signal generator configured to ensure that the reticle stage and the wafer stage move at a speed whose speed curve is a sinusoidal curve.

During the scanning and exposing according to the scanning and exposing method of the present disclosure, the scanning and exposing motion is a sinusoidal motion. During the scanning of a single exposure shot, it may begin to scan the exposure shot once a wafer stage and a reticle stage begin to accelerate from zero speed, and the scanning and exposing may not end until the speeds of the wafer stage and the reticle decrease to zero. That is, the effective time of the scanning and exposing may start from nearly the time when the speed of the scanning and exposing is zero and may not end until the speed of the scanning and exposing decreases to zero.

However, in the conventional techniques, the scanning and exposing motion is a rapid-acceleration uniform-speed rapid-deceleration scanning and exposing motion, and the effective time of the scanning and exposing may start from only the time when the speed of the scanning and exposing reaches a uniform speed and may only last a short period of time at the uniform speed. Therefore, in the present disclosure, there is less waste of time due to the scanning and exposing can be performed during the acceleration stage, the stabilization stage and the deceleration stage. Thereby, the effective time of the scanning and exposing in the scanning and exposing motion is greatly increased and the production efficiency of the wafer is improved.

Moreover, the acceleration and the deceleration of the sinusoidal scanning is more gently performed, and the disturbance suffered by the lithography machine due to the scanning and exposing process is thus much less. Furthermore, the scanning mode is the sinusoidal scanning, i.e., the wafer stage and the reticle stage move in a single frequency. Therefore when the frequency spectrum analysis is performed on the acceleration (the acceleration curve is a cosine curve) of the output of the lithography machine, the resultant frequency spectrum analysis curve is relatively simple, i.e., there is only low frequency distribution but no high frequency distribution in the frequency spectrum analysis curve.

Therefore the disturbance suffered by the lithography machine is easy to be simulated and analyzed and thus is easy to be suppressed and compensated. As a result, the precision of a pattern formed on the wafer may be improved.

DETAILED DESCRIPTION OF THE DISCLOSURE

Several solutions may be directed to solve the above-mentioned problems. One of the solutions is to increase the uniform speed for the scanning and exposing during the scanning and exposing motion. However, once the uniform speed for the scanning and exposing increases, the acceleration of the acceleration stage and the deceleration of the deceleration stage must increase. This also means that more stabilization time ($t_{st}$) and more deceleration time ($t_{de}$) may be wasted during the entire period of time for scanning and exposing.

Moreover, when the uniform speed for the scanning and exposing increases, there is limit possibility for the speed of the scanning and exposing to increase with various physical limits, which means that the speed of the scanning and exposing cannot to be increased to be too large. For example, if the speed of the scanning and exposing increase to be too large, the time needed for the scanning and exposing becomes short and the light intensity of the light needed for the scanning and exposing also becomes large. The light for exposing with higher light intensity will increase the cost of the lithography machine and reduce the reliability of the lithography machine.

Moreover, the increased speed for the scanning and exposing means increased current of a driving motor for the wafer stage and the reticle stage, which will increase the need of the wafer stage and the reticle stage for heat dissipation and will increase the control, by the lithography machine, of expansion caused by heating and contraction caused by cooling. In this case, more complicated temperature control equipments are needed to be provided for the lithography machine. This causes the total mass of the lithography machine to increase, limits the increase of the speed for scanning and exposing, and leads to a more complicate configuration for the lithography machine. As a result, this solution is not practical.

There is also provided another solution directed to the above mentioned problems. In this solution, the mass of the wafer stage is decreased. For example, a magnetically levitated wafer stage may be used instead of an air-cushioned wafer stage used in the conventional techniques. Thus the mass of the wafer stage can be decreased and the speed of the scanning and exposing may be increased.

However, the magnetically levitated wafer stage does not operate stably enough compared with the air-cushioned wafer stage. This causes the positioning and motion of the wafer stage to have less precision and finally affect the precision of the pattern formed on the wafer. Moreover, the magnetically levitated wafer stage needs to be controlled by a closed-loop control system, leading to increasing cost for the Lithography Technology. As a result, this solution also has limits.

Figure 1:
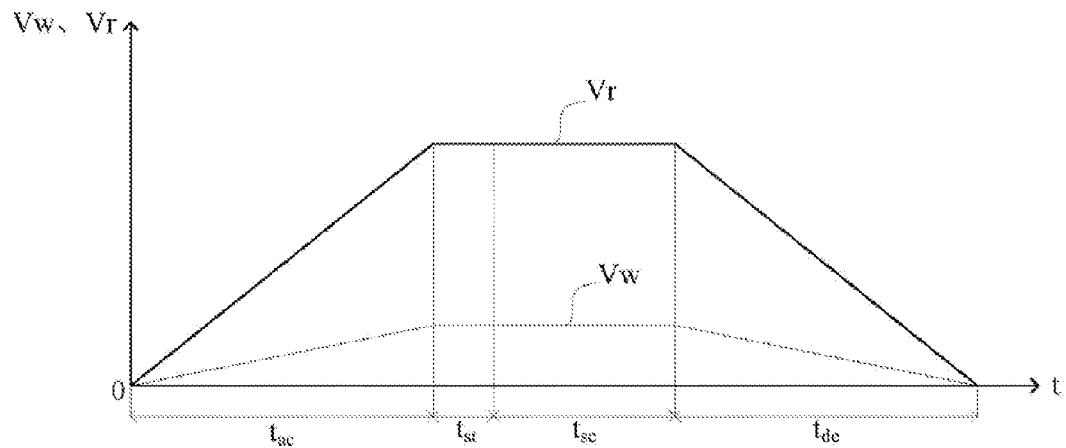
FIG. 1 illustrates a diagram of speed curves of a wafer stage and a reticle stage during a scanning and exposing motion of a single exposure shot on a wafer according to the conventional techniques.
Figure 2:
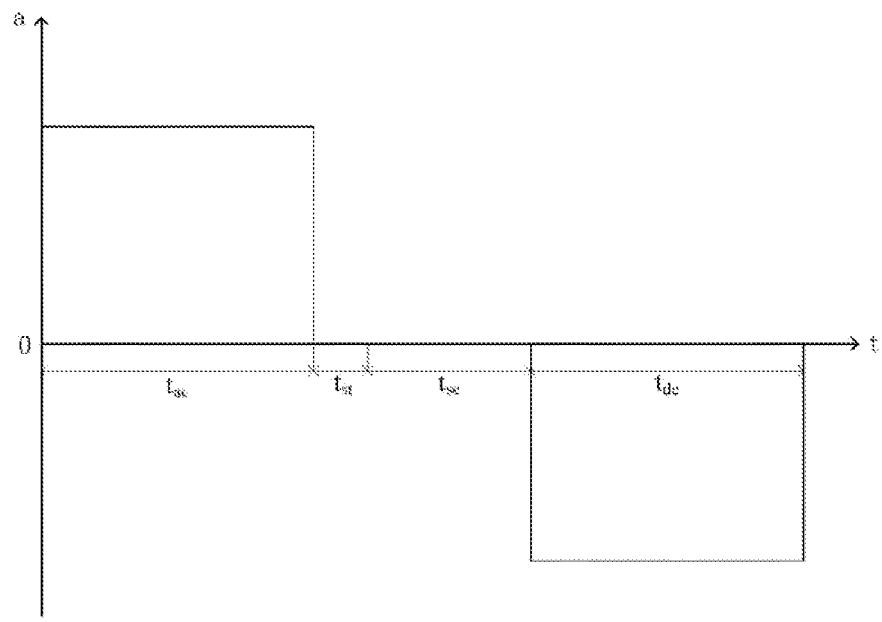
FIG. 2 illustrates a diagram of acceleration curves of the wafer stage during a scanning and exposing motion of a single exposure shot on a wafer according to the conventional techniques.

In addition, the disturbance suffered by the lithography machine often cannot be suppressed and compensated effectively and finally affect the precision of the pattern formed on the wafer. FIG. 2 is a diagram of acceleration curves of the wafer stage during a scanning and exposing motion of a single exposure shot on a wafer.

As shown in FIG. 2, during the whole scanning and exposing process, there are rapid-acceleration stage and rapid-deceleration stage for the wafer stage, and the magnitudes of the acceleration and the deceleration a may generally reach 1g-4g (g denotes gravitational acceleration), leading to the disturbance suffered by the step-and-scan lithography machine. Since there are requirements of motion precision and synchronization accuracy of the wafer stage and the reticle stage, the disturbance suffered by the step-and-scan lithography machine must be suppressed and compensated effectively so as to improve the precision of the pattern formed on the wafer.

In order to effectively suppress and compensate the disturbance suffered by the lithography machine, the disturbance suffered by the step-and-scan lithography machine needs to be simulated and analyzed. It may be found after frequency analysis of the output acceleration of the wafer stage that the frequency analysis curve is extremely complicated and there are many high frequency distributions. Thus the simulation and analysis of the disturbance suffered by the lithography machine are very difficult or inaccurate, causing that the disturbance suffered by the step-and-scan lithography machine cannot be effectively suppressed and compensated.

In order to solve the above mentioned problems, an improved scanning and exposing method for a lithography machine is provided. During the scanning and exposing of a whole wafer by using the disclosed method, the scanning and exposing process for the whole wafer includes two alternately circulated motions: a scanning and exposing motion and a stepping motion; and the scanning and exposing motion according to the present disclosure is a sinusoidal motion, i.e. the speed curves of a wafer stage and a reticle stage during the scanning and exposing motion are sinusoidal waves rather than a rapid-acceleration uniform-speed rapid-deceleration scanning and exposing motion in the conventional techniques.

Moreover, during the scanning and exposing motion, the magnitudes of the speeds of the wafer stage and the reticle stage gradually increase from zero to the maximum value and then decrease to zero. During the oscillatory scanning or sinusoidal scanning of a single exposure shot, it may begin to scan the exposure shot once a wafer stage and a reticle stage begin to accelerate from zero speed, and the scanning and exposing may not end until the speeds of the wafer stage and the reticle decrease to zero.

That is, the effective time of the scanning and exposing may start from nearly the time when the speed of the scanning and exposing is zero and may not end until the speed of the scanning and exposing decreases to zero. Therefore, in the present disclosure, the effective time of the scanning and exposing in the scanning and exposing motion is greatly increased and the production efficiency of the wafer is improved.

In the following, the technical solution of the present disclosure will be described clearly and integrally by reference to the specific embodiments taken in conjunction with the accompanying drawings. According to those embodiments, those skilled in the art may obtain other embodiments without any creative work, which are all within the scope of the present disclosure.

Figure 3:
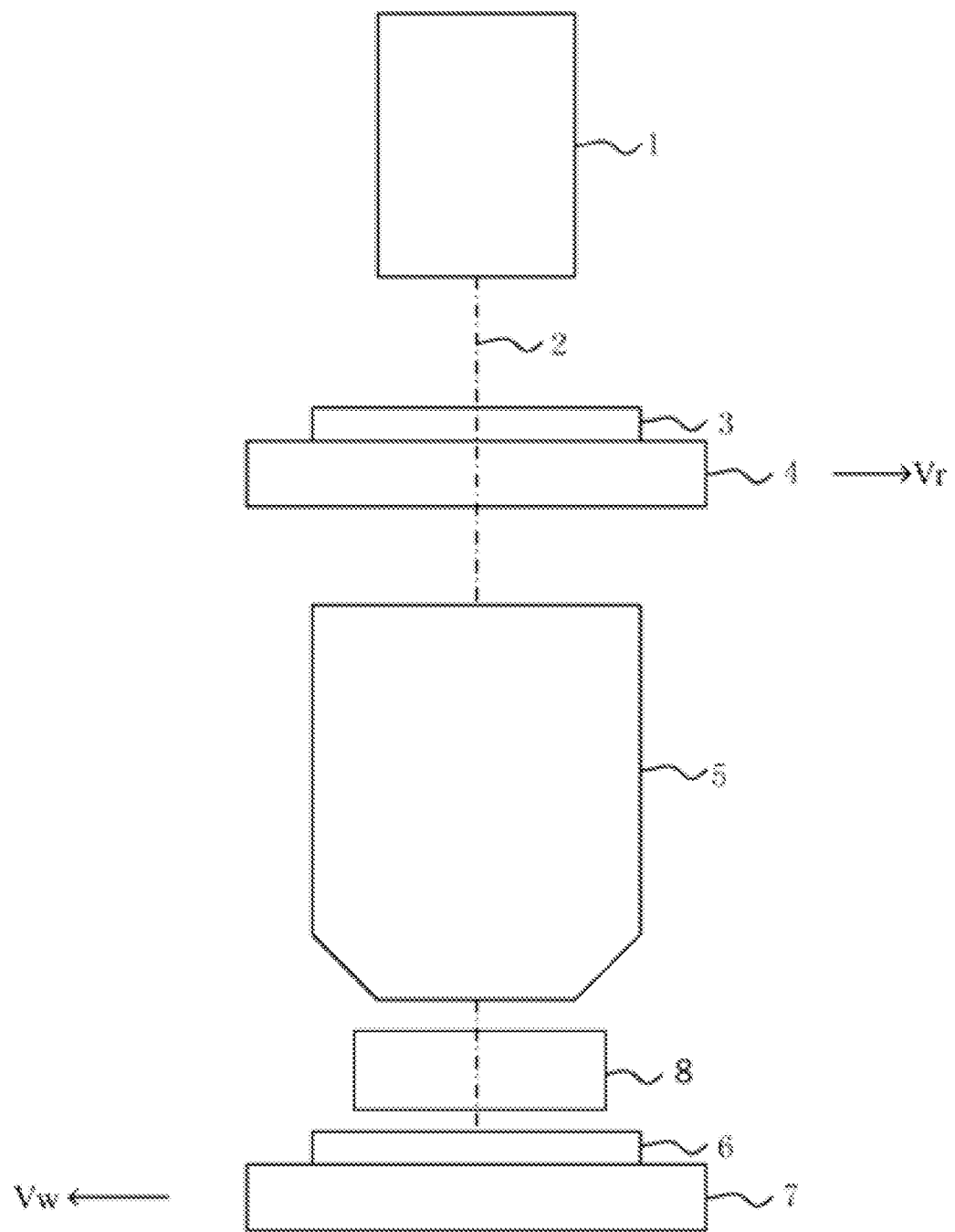
FIG. 3 illustrates a structural diagram of a lithography machine according to the present disclosure.

FIG. 3 is a schematic structural diagram of a lithography machine according to the present disclosure. As shown in FIG. 3, a lithography machine according to the present disclosure includes an optical system 1, a light source (not shown) configured to form a light beam 2, a reticle stage 4 configured to carry a reticle mask 3, an object lens system 5 configured to project the light beam 2 passing through the reticle mask 3 onto a wafer 6 coated with photoresist and a wafer stage 7 configured to carry the wafer 6.

Figure 4:
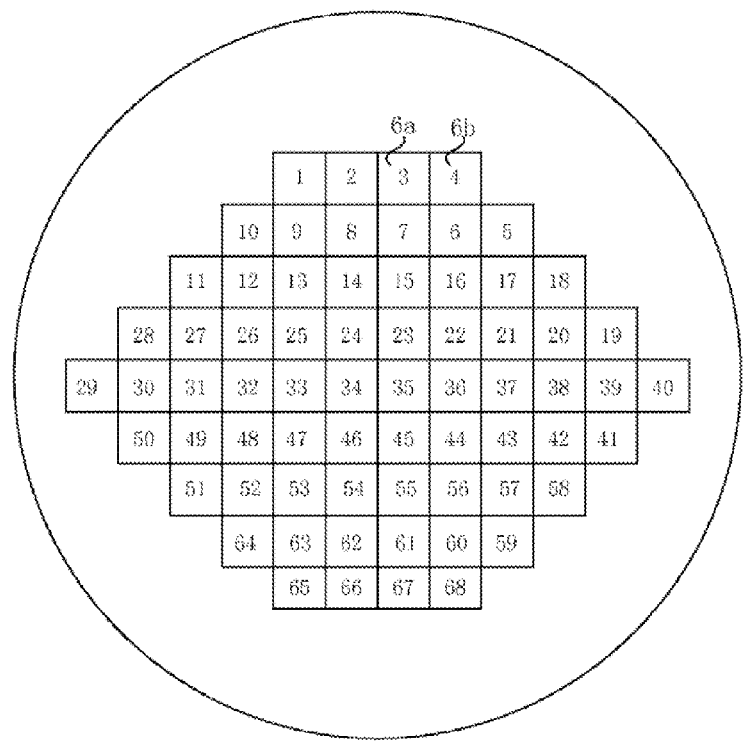
FIG. 4 illustrates a diagram of divide of a region to be exposed on a wafer into exposure shots.

FIG. 4 is a diagram of a wafer with divided regions as exposure shots to be exposed, and the numbers in FIG. 4 indicate an exposure sequence for the exposure shots. As shown in FIG. 4, a region on the wafer to be exposed can be divided into two or more exposure shots each of which may include one or more chips.

Reference is now made to FIG. 3 and FIG. 4 to illustrate the scanning and exposing method for the lithography machine according to the present disclosure. The wafer stage 7 is stepped to an exposure shot on the wafer 6, for example an exposure shot 6a. After alignment, the reticle stage 4 carrying the reticle mask 3 and the wafer stage 7 carrying the wafer 6 move synchronously in different directions with determined speeds Vr and Vw, respectively. That is, the reticle stage 4 is moved above the object lens system 5 and the wafer stage 7 is moved under the object lens system 5. The exposure shot 6a is scanned and exposed. Under the irradiation of the light beam 2, a pattern on the reticle mask 3 and corresponding to the exposure shot 6a on the wafer 6 is projected onto the wafer 6 coated with photoresist via the object lens system 5, thus the transfer of the pattern of the reticle mask on the wafer is achieved.

Figure 5:
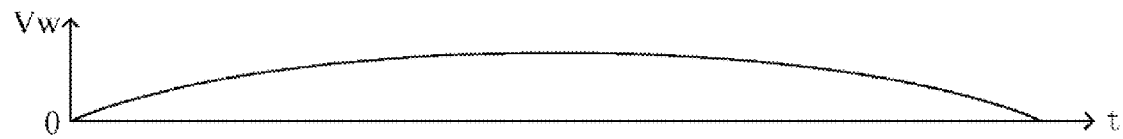
FIG. 5 illustrates a diagram of speed curve of a wafer stage during scanning and exposing of an exposure shot according to an embodiment of the present disclosure.
Figure 6:
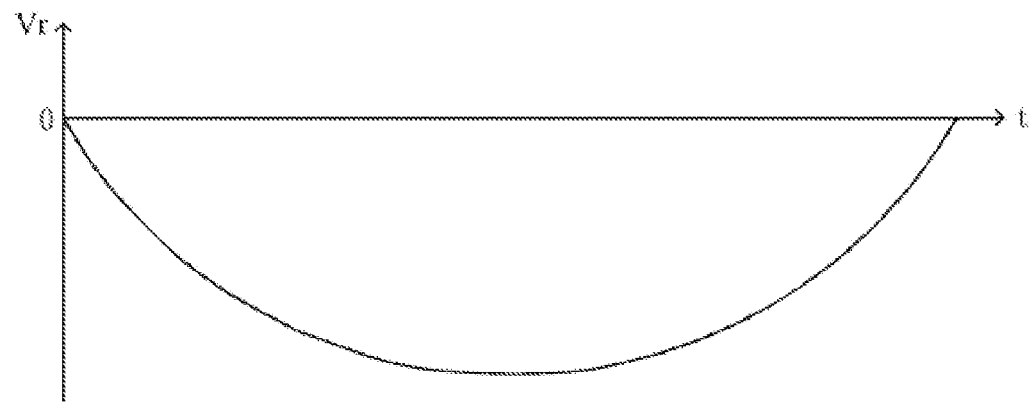
FIG. 6 illustrates a diagram of speed curve of a reticle stage during scanning and exposing of an exposure shot according to the above mentioned embodiment of the present disclosure.

FIG. 5 is a diagram of speed curve of a wafer stage during scanning and exposing of an exposure shot according to the present disclosure. FIG. 6 is a diagram of speed curve of a reticle stage during scanning and exposing of an exposure shot according to the present disclosure. As shown in FIG. 5 and FIG. 6, during the scanning and exposing of the exposure shot 6a, the speed curves (relation curves between speed and time) of the wafer stage 7 and the reticle stage 4 are sinusoidal curves, and the magnitudes of the speeds of the wafer stage 7 and the reticle stage 4 gradually increase from zero to a maximum value and then gradually decrease to zero, and the ratio of the magnitude of the speed of the wafer stage 7 to the magnitude of the speed of the reticle stage 4 is always equal to the ratio of the size of a pattern finally formed on the wafer 6 to the size of the pattern of the reticle mask 3. The wafer stage 7 and the reticle stage 4 move synchronously in different directions. In certain embodiments, the ratio of the size of the pattern of the reticle mask 3 to the size of a pattern finally formed on the wafer 6 is 4:1 or 5:1 or 10:1, namely Vr: Vw=−4:1 or −5:1 or −10:1 (the minus sign represents that the speed of the wafer stage 7 and the speed of the reticle stage 4 are in different direction).

After the exposure shot 6a is scanned and exposed, the wafer stage 7 is stepped to is another exposure shot 6b on the wafer 6 (the exposure shot 6b may be located in the same row as the exposure shot 6a, and may also located in a row adjacent to the exposure shot 6a). After alignment, the reticle stage 4 carrying the reticle mask 3 and the wafer stage 7 carrying the wafer 6 move synchronously in different directions with determined speeds Vr and Vw respectively, such that the reticle stage 4 is located above the object lens system 5 and the wafer stage 7 is located under the object lens system 5, respectively. The exposure shot 6b is scanned and exposed. Under the irradiation of the light beam 2, a pattern on the reticle mask 3 and corresponding to the exposure shot 6b on the wafer 6 is projected onto the wafer 6 coated with photoresist via the object lens system 5, thus the transfer of the pattern on the reticle mask is achieved.

Figure 7:
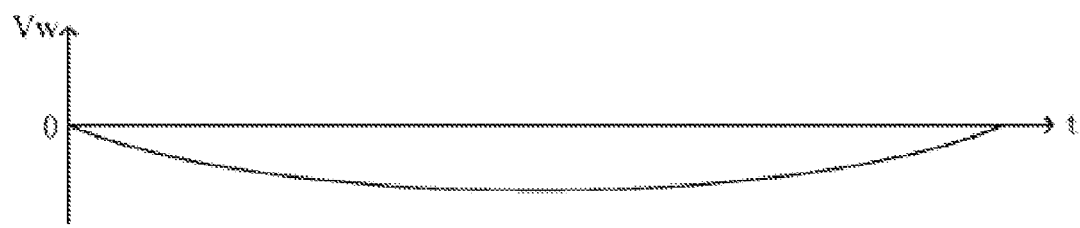
FIG. 7 illustrates a diagram of speed curve of the wafer stage during scanning and exposing of another exposure shot according to the above mentioned embodiment of the present disclosure.
Figure 8:
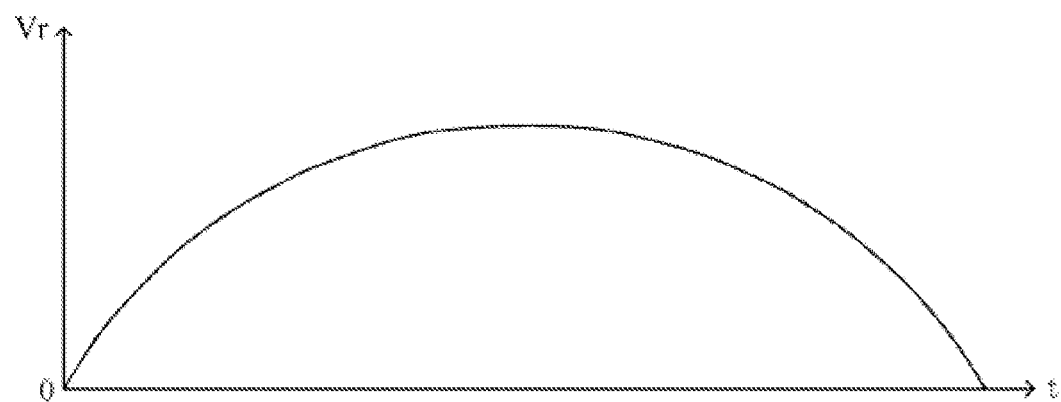
FIG. 8 illustrates a diagram of speed curve of the reticle stage during scanning and exposing of another exposure shot according to the above mentioned embodiment of the present disclosure.

FIG. 7 is a diagram of speed curve of the wafer stage 7 during scanning and exposing of another exposure shot according to the present disclosure. FIG. 8 is a diagram of speed curve of the reticle stage 4 during scanning and exposing of another exposure shot according to the present disclosure.

As shown in FIG. 7 and FIG. 8, during the scanning and exposing of the exposure shot 6b, the speed curves of the wafer stage 7 and the reticle stage 4 are sinusoidal curves, and the magnitudes of the speeds of the wafer stage 7 and the reticle stage 4 gradually increase from zero to a maximum value and then gradually decrease to zero, and the ratio of the magnitude of the speed of the wafer stage 7 to the magnitude of the speed of the reticle stage 4 is always equal to the ratio of the size of a pattern finally formed on the wafer 6 to the size of the pattern of the reticle mask 3. The wafer stage 7 and the reticle stage 4 move synchronously in different directions.

The stepping motion and the scanning and exposing motion mentioned above are alternately circulated, so as to scan and expose all the exposure shots on the wafer 6. Then a pattern with a reduced scale is finally duplicated onto the wafer after processes such as shaping and developing.

In conjunction with FIG. 5 to FIG. 8, during the successive scanning and exposing processes of the exposure shot 6a and the exposure shot 6b, the two speeds of the wafer stage 7 have the same magnitude and opposite directions, and the two speeds of the reticle stage 4 have the same magnitude and opposite directions. The scanning path used in scanning and exposing one by one the exposure shots on the wafer may be set according to the requirement. According to the chosen scanning path, two exposure shots are scanned and exposed successively, wherein the two speeds of the wafer stage 7 have the same magnitude and the same or opposite directions, and the two speeds of the reticle stage 4 have the same magnitude and the same or opposite directions. For example, the scanning path may be Z-shaped. Furthermore, the scanning path may also be a point-to-point path (the two points located diagonally). It is to be noted that the scanning path is not limited to the embodiments given in the present disclosure.

In the scanning and exposing motion, there are many ways to ensure that the speed curves of the wafer stage 7 and the reticle stage 8 are sinusoidal curves. In the present embodiment, the lithography machine may further include a long-range motion motor (not shown) and a signal generator (not shown) connected with the long-range motion motor. The signal generator may generate a cosine signal (since the speed curves of the reticle stage and the wafer stage are sinusoidal curves, the relation curve between the force on the wafer stage or the reticle stage and time is cosine curves, and therefore the long-range motion motor needs to be applied with a cosine signal). The long-range motion motor (the motor may be a linear motor and may also be a Lorentz motor) is connected with the reticle stage 4 and the wafer stage 7 respectively and drives the reticle stage 4 and the wafer stage 7.

If the signal generator inputs a cosine signal to the long-range motion motor, it is realized that the speed curves of the wafer stage 7 and the reticle stage 4 are sinusoidal curves. Certainly, in other embodiments of the present disclosure, there may also be other ways to ensure that the speed curves of the wafer stage 7 and the reticle stage 8 are sinusoidal curves. For example, this object may also be achieved if the wafer stage 7 or the reticle stage 4 is a portion of an oscillator which can generate a sinusoidal speed signal. Here, the mathematical expression of said cosine curve may be expressed as $Y=A\cos Bt$, wherein A and B are all non-zero constants, and t denotes time.

The actual output speed curve is not necessarily to be a sinusoidal curve due to many factors. In order to ensure the accuracy of the scanning and exposing, the positions or speeds of the wafer stage 7 and reticle stage 4 need to be modified in real time. Therefore, in the present disclosure, the lithography machine may further include an interferometer or a scale (not shown), a short-range motion motor (not shown).

The interferometer or scale is used to detect the positions of the wafer stage 7 and is the reticle stage 4. The actually output displacements and speeds of the wafer stage 7 and the reticle stage 4 may be obtained according to the detected positions of the wafer stage 7 and the reticle stage 4. Thus the deviations of the displacements and speeds of the wafer stage 7 and the reticle stage 4 can be obtained. The short-range motion motor is connected with the wafer stage 7 and the reticle stage 4 and can drive the wafer stage 7 and the reticle stage 4. The short-range motion motor may drive the wafer stage 7 and the reticle stage 4 to move according to the actually output displacements and speeds of the wafer stage 7 and the reticle stage 4 diagonally, so as to modify the speeds and the displacements the wafer stage 7 and the reticle stage 4 in real time and decrease the deviations of the displacements and speed of the wafer stage 7 and the reticle stage 4.

During the scanning and disposing process, photochemical reaction occurs in the photoresist to transfer the pattern on the reticle mask. Therefore, the light source is an important aspect during the scanning and exposing process. One important aspect of the light source is light intensity. The magnitude of the light intensity (the absolute value of the light intensity) is in close relationship with the speed of the scanning and exposing of the wafer stage.

Therefore, during the scanning and exposing, the magnitude of the light intensity of the light source for exposing needs to be changed synchronously with the magnitudes of the speeds of the wafer stage and the reticle stage. The synchronous change herein means that the variation curve of the magnitude of the light intensity of the light source for exposing with time is also a sinusoidal curve.

When the magnitudes of the speeds of the wafer stage and the reticle stage are zero, the magnitude of the light intensity also needs to be zero; when the magnitudes of the speeds of the wafer stage and the reticle stage are maximum values, the magnitude of the light intensity also needs to be maximum value. Moreover, there is no phase deviation between the sinusoidal curve which the magnitude of the light intensity of the light source for exposing follows and the speed curves of the wafer stage and the reticle stage.

During the scanning and disposing process, if there is damping which causes asynchronous situation between any two of the speeds of the wafer stage and the reticle stage and the light intensity, namely there is phase deviation between the sinusoidal curve which the magnitude of the light intensity follows and the speed curves of the wafer stage and the reticle is stage, a phase displacement means is needed to allow the wafer stage and the reticle stage and the light source to move synchronously, so as to ensure the precision of the scanning and exposing.

It should be noted that the magnitude of the light intensity of the light source needs to be adjusted to the type of the photoresist and the speeds of the scanning and exposing of the stage and the reticle stage.

The lithography machine according to the present disclosure may further comprise a liquid immersion control device 8. With such configuration, the lithography machine becomes an immersion lithography machine. The principle of the immersion lithography machine is that the space between a lower surface of the last lens (referring to a lens that is closest to the wafer in the light path of the exposing) of the object lens system and the wafer is filled in with certain liquid (water or other liquid), so as to increase the numerical aperture (NA) of the lithography machine and thus increase the resolution of the lithography.

That is, the immersion lithography machine according to the present disclosure includes: an optical system, a light source configured to form a light beam, a reticle stage configured to carry a reticle mask, an object lens system including more than one lens, a wafer stage configured to carry the wafer, a liquid immersion control device 8 configured to fill the space between a last lens of the object lens system and the wafer with liquid, a signal generator configured to generate a cosine signal, the signal generator is configured to move the reticle stage and the wafer stage at a speed whose speed curve is a sinusoidal curve.

It is needed to be illustrated that the mathematical expression of said sinusoidal curve may be expressed as Y=A sin Bt, wherein A and B are all non-zero constants, t denotes time, and V denotes speed. Therefore, when t=0, it can be ensured that the magnitudes of the speeds of the wafer stage and the reticle stage at the beginning of the scanning and exposing are zero; when t=¼T (T is the periodic time of the sinusoidal curve), it can be ensured that the speeds of the wafer stage and the reticle stage after the scanning and exposing continues for a time are maximum values; when t=½T, it can be ensured that the magnitudes of the speeds of the wafer stage and the reticle stage at the end of the scanning and exposing are zero.

Figure 9:
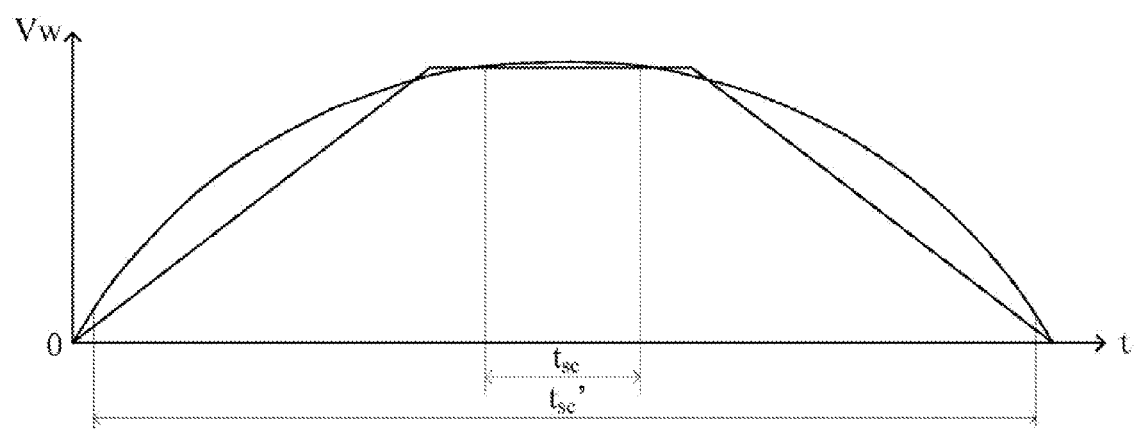
FIG. 9 illustrates a diagram of comparison of the speed curve of the reticle stage during the scanning and exposing motion according to the present disclosure to the speed curve of the reticle stage during scanning and exposing motion according to the conventional techniques.

FIG. 9 is a diagram of comparison of the speed curve of the reticle stage during the scanning and exposing motion according to the present disclosure to the speed curve of the is reticle stage during the scanning and exposing motion according to the conventional techniques. As can be seen from FIG. 9, during the scanning and exposing by using the scanning and exposing method according to the present disclosure, the scanning and exposing motion is a sinusoidal motion, and the speeds of the wafer stage and the reticle stage gradually increase from zero to the maximum value and then decrease to zero. During the sinusoidal scanning of a single exposure shot, it may begin to scan the exposure shot once the wafer stage and the reticle stage begin to accelerate from zero speed, and the scanning and exposing may not end until the speeds of the wafer stage and the reticle decrease to zero.

That is, the effective time $t_{sc}'$ of the scanning and exposing may start from nearly the time when the speed of the scanning and exposing is zero and may not end until the speed of the scanning and exposing decreases to zero. The scanning and exposing motion in the conventional techniques is a rapid-acceleration uniform-speed rapid-deceleration motion scanning and exposing motion in the conventional techniques. The effective time $t_{SC}$ of the scanning and exposing may only start form the time when the speed of the scanning and exposing actually reaches a uniform speed and may only last a short period of time (at this time the speed of the exposing doesn't decrease). Therefore, in the present disclosure, there is no waste of time due to the scanning and exposing invalid time during the acceleration stage, the stabilization stage and the deceleration stage. As a result, the effective time of the scanning and exposing in the scanning and exposing motion is greatly increased and the production efficiency of the wafer is improved.

Moreover, the acceleration and the deceleration of the sinusoidal scanning is more gently, the disturbance suffered by the lithography machine due to the scanning and exposing process is thus much less. Furthermore, the scanning mode is the sinusoidal scanning, i.e. the wafer stage and the reticle stage moves in a single frequency. Therefore when the frequency spectrum analysis is perform on the acceleration (the acceleration curve is a cosine curve) of the output of the lithography machine, the resultant frequency spectrum analysis curve is relatively simple, i.e. there is only low frequency distribution but no high frequency distribution in the frequency spectrum analysis curve. Therefore, it is easy to simulate and analyze and thus easy to suppress and compensate the disturbance suffered by the lithography machine, and thus the precision of a pattern formed on the wafer is improved.

Furthermore, the scanning and exposing may be performed during the entire process is of the scanning and exposing motion, and the acceleration process and the deceleration process of the scanning and exposing are more gentle, thus there is larger possibility for the speed of the scanning and exposing to increase without various physical limits.

By above illustrations through the embodiments, those skilled in the art should understand the present disclosure and be able to implement and use the present disclosure. Those skilled in the art may perform various changes and modifications to the above mentioned embodiments according to the principle described herein without departing the spirit and scope of the present disclosure. Therefore, the present disclosure should not be considered to be limited by the above mentioned embodiments herein and the scope of protection of the present disclosure should be defined by the appending claims.

What is claimed is:

1. A scanning and exposing method for a lithography machine containing a wafer stage carrying a wafer to be exposed and a reticle stage carrying a reticle mask, a region on the wafer to be exposed being divided into two or more exposure shots, the method comprising:
   stepping the wafer stage to a first exposure shot;
   moving the wafer stage and the reticle stage synchronously in opposite directions respectively for scanning and exposing the first exposure shot, wherein:
   during the scanning and exposing of the first exposure shot, the speed curves of the wafer stage and the reticle stage are sinusoidal curves, and magnitudes of the speeds of the wafer stage and the reticle stage gradually increase from zero to maximum values and then decrease to zero respectively,
   the ratio of the magnitude of the speed of the wafer stage to the magnitude of the speed of the reticle stage is equal to a ratio of a size of a pattern finally is formed on the wafer to a size of a pattern of the reticle mask, and
   during the scanning and exposing of the first exposure shot, a light intensity, of a light source for exposing, and the magnitudes of the speeds of the wafer stage and the reticle stage change synchronously, and a variation curve of magnitude of the light intensity versus time is a sinusoidal curve.

2. The scanning and exposing method according to claim 1, wherein the wafer stage is stepped to a second exposure shot after the first exposure shot is scanned and exposed, and the wafer stage and the reticle stage move synchronously in different directions respectively, to scan and expose the second exposure shot.

3. The scanning and exposing method according to claim 1, wherein the wafer stage and the reticle stage are driven by a long-range motion motor into which a cosine signal is input, during the scanning and exposing of the first exposure shot, so that the speed curves of the wafer stage and the reticle stage are sinusoidal curves.

4. The scanning and exposing method according to claim 3, wherein the positions of the wafer stage and the reticle stage are detected by an interferometer or a scale in real-time, during the scanning and exposing of the exposure shot, so as to obtain actually output displacements and speeds of the reticle stage and the wafer stage, and the wafer stage and the reticle stage are driven by a short-range motion motor according to actually output displacements and speeds of the reticle stage and the wafer stage, so as to correct the speeds and displacements of the wafer stage and the reticle stage in real-time.

5. The scanning and exposing method according to claim 1, wherein the lithography machine is an immersion lithography machine.

6. A lithography machine, comprising:

a light source configured to provide a light beam having a light intensity, a variation curve of magnitude of the light intensity versus time being a sinusoidal curve;

an optical system;

a reticle stage configured to carry a reticle mask;

an object lens system configured to project the light beam onto a wafer coated with photoresist, the object lens system comprising more than one lens;

a wafer stage configured to carry the wafer; and a signal generator configured to ensure that the reticle stage and the wafer stage move synchronously in opposite directions at a speed whose speed curve is a sinusoidal curve, wherein the light intensity and magnitudes of the speeds of the wafer stage and the reticle stage change synchronously.

7. The lithography machine according to claim 6, wherein the lithography machine further comprises a liquid immersion control device which is configured to fill the space between a last lens of the object lens system and the wafer with liquid.

8. The lithography machine according to claim 6, wherein the lithography machine further comprises a long-range motion motor connected with the signal generator, the long-range motion motor is connected to the reticle stage and the wafer stage respectively and is configured to drive the reticle stage and the wafer stage, so that the speed curves of the wafer stage and the reticle stage are sinusoidal curves.

9. The lithography machine according to claim 8, wherein the lithography machine further comprises an interferometer or a scale and a short-range motion motor, the interferometer or the scale is configured to detect the positions of the wafer stage and the reticle stage in real time, and the short-range motion motor is connected to the wafer stage and the reticle stage and is configured to drive the reticle stage and the wafer stage, so as to correct speeds and displacements of the wafer stage and the reticle stage in real-time.

* * * * *